(12) United States Patent
Braceras et al.

(10) Patent No.: US 6,999,547 B2
(45) Date of Patent: Feb. 14, 2006

(54) DELAY-LOCK-LOOP WITH IMPROVED ACCURACY AND RANGE

(75) Inventors: George M. Braceras, Essex Junction, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 492 days.

(21) Appl. No.: 10/065,840

(22) Filed: Nov. 25, 2002

(65) Prior Publication Data

US 2004/0101079 A1   May 27, 2004

(51) Int. Cl.
*H04L 7/033* (2006.01)
(52) U.S. Cl. ................. 375/371; 375/373; 327/158
(58) Field of Classification Search ............ 375/294, 375/299, 376, 226, 371, 373; 327/231, 236, 327/141, 142, 144, 149, 150, 158, 153, 161, 327/244, 261, 263, 269
See application file for complete search history.

(56) References Cited

U.S. PATENT DOCUMENTS

| | | | | |
|---|---|---|---|---|
| 3,555,194 | A * | 1/1971 | Goto ........................... | 370/507 |
| 5,854,797 | A | 12/1998 | Schwartz et al. | |
| 6,073,259 | A | 6/2000 | Sartschev et al. | |
| 6,078,200 | A * | 6/2000 | Miyano ...................... | 327/142 |
| 6,094,082 | A | 7/2000 | Gaudet | |
| 6,121,808 | A | 9/2000 | Gaudet | |
| 6,125,157 | A | 9/2000 | Donnelly et al. | |
| 6,194,930 | B1 | 2/2001 | Matsuzaki et al. | |
| 6,445,234 | B1 * | 9/2002 | Yoon et al. ................ | 327/161 |
| 6,605,969 | B2 * | 8/2003 | Mikhalev et al. ........... | 327/158 |
| 6,665,230 | B1 * | 12/2003 | Shrader et al. ............. | 365/233 |
| 6,735,148 | B2 * | 5/2004 | Gomm ....................... | 365/233 |
| 6,812,799 | B2 * | 11/2004 | Kirsch ......................... | 331/57 |
| 6,856,658 | B1 * | 2/2005 | Baba et al. ................. | 375/355 |
| 6,879,321 | B2 * | 4/2005 | Santou ....................... | 345/213 |
| 6,930,524 | B2 * | 8/2005 | Drexler ....................... | 327/158 |
| 6,950,956 | B2 * | 9/2005 | Zerbe et al. ................ | 713/400 |
| 2002/0044325 | A1 * | 4/2002 | Noguti ....................... | 359/189 |
| 2002/0057119 | A1 * | 5/2002 | Stubbs et al. .............. | 327/158 |
| 2003/0001637 | A1 * | 1/2003 | Jung .......................... | 327/158 |
| 2003/0001647 | A1 * | 1/2003 | Schroedinger ............. | 327/247 |
| 2003/0039328 | A1 * | 2/2003 | Tomofuji et al. .......... | 375/354 |
| 2003/0179028 | A1 * | 9/2003 | Kizer et al. ................ | 327/158 |

* cited by examiner

*Primary Examiner*—Tesfaldet Bocure
*Assistant Examiner*—Naheed Ejaz
(74) *Attorney, Agent, or Firm*—Gibb I.P. Law Firm, LLC; Robert A. Walsh, Esq.

(57) ABSTRACT

A Delay-Lock-Loop circuit and a method for producing a phase shift comprises a phase generator producing a first and second clock signal having a first and second rising edge, respectively, wherein a timing difference between the first and second rising edges is equal to a desired cycle time; a delay circuit operable to receive the first clock signal and to produce a delayed clock signal; and a latch element connected to the delay circuit, and operable to check whether the delayed clock signal is delayed by an amount equal to the desired cycle time; a plurality of serially connected binary-weighted inverters connected to the latch element, which are operable to adjust the delay of the delayed clock signal to be equal to the desired cycle time; and a phase-shifted delay circuit connected to the delay circuit, and operable to produce multiple degrees of phase shift of the delayed clock signal.

20 Claims, 9 Drawing Sheets

DELAY-LOCK-LOOP WITH IMPROVED ACCURACY AND RANGE

BACKGROUND OF THE INVENTION

1. Field of the Invention

The present invention generally relates to delay-lock-loop circuits, and more particularly to a delay-lock-loop circuit with an adjustable delay chain that does not require a digital to analog converter.

2. Description of the Related Art

Delay-lock-loop (DLL) circuits can be used to create, control, or modify clock signals, either within a semiconductor device or between several semiconductor components. FIG. 1 demonstrates a first clock signal (KCLK) and three additional clock signals (KCLKB, KCLKC, and KCLKD), which have been derived from the first clock. In this example, the derived clocks have been phase shifted from the first clock by 90°, 180°, and 270°, respectively. One application for these derived clocks is to synchronize different components within a system by providing specific clock edges for each component. Data signals that are aligned with the first clock signal, and transition on both the rising and falling edges of the first clock, can be sampled by another circuit or component by clock signals KCLKB and KLCKD, respectively. These clock signals have been phase shifted by 90° from the rising and falling edges, such that they will be exactly positioned between the transitions of the aligned data signal and will sample the data in the middle of the data valid window.

Creating, controlling, and modifying clock signals with a DLL circuit has been the subject of conventional devices. The basic premise behind the DLL circuit is to provide an adjustable delay circuit that can be tuned to match the frequency of a supplied clock signal, and then using this tuned delay to create the modified clock signals. Once a circuit element is tuned to match the base clock, it is relatively straightforward to derive phase shifted clocks, delayed clocks, or clocks that operate at a multiple of the supplied clocks' frequency.

FIG. 2 shows an example of a prior art DLL design, wherein a clock signal 100 is received by clock buffer 101 which generates internal clock CLKIN 110. The internal clock drives into the delay circuit 120, which is comprised of individual delay elements 121. In this instance, the individual delay elements 121 are comprised of two inverters, or the minimum digital delay element for the given technology. Outputs from each stage of the delay chain (da, db, dc, dn) are fed into a logic block known as a mux (multiplexer) tree 150, which is used to steer a specific delay value to the appropriate phase vectors 155. The number of delay elements required for each phase is determined by comparing the original clock input 110 to the desired phase vector 135 for 360° with the phase compare logic 130. The mux tree controls 140 receives the output of the phase comparator and then adjusts the mux tree inputs depending on whether more, or fewer, delay elements are needed to be able to match the incoming clock frequencies.

Prior art DLL circuits designed in the manner of FIG. 2 suffer from several problems, most of which relate to the minimum delay step. Because this style of DLL uses fixed delay elements, the accuracy of the phase alignment is limited to this minimum delay. Known as clock jitter, the error in accurately reproducing phase vectors directly limits the maximum frequency of a given system. Even with advanced technologies the minimum delay element might be in the order of 20 ps, a significant amount when designing a clock that might need to capture data within a 200 ps window. Using these advanced technologies at slower cycles reveals another problem with this style of DLL; the large number of minimum delay elements required to match the lower frequency and the resulting complexity of the mux tree and mux tree logic. As the mux tree grows, it becomes increasingly difficult to match all paths through the tree, and therefore clock jitter worsens.

To eliminate the shortcomings inherent with the fixed delay element style of DLL (FIG. 2) an analog approach has been proposed in U.S. Pat. No. 6,125,157 issued to Donnelly et. al., further illustrated in FIG. 3, wherein a block diagram of this DLL approach is given. A number of adjustable analog delay circuits 210 replace the fixed delay elements. In this approach four adjustable delay circuits are used to provide four clock phases. In practice, any number of delay elements can be used to provide any number of additional clock phases. Only the output from the last adjustable delay circuit Phase 360° is used to compare with the incoming clock 215 at the phase comparator 220.

Moreover, the mux tree has been eliminated. In this DLL style, the delay chain is essentially stretched and compressed by controlling the delay through each of the analog delay elements until the output from the last delay element (Phase 360o) aligns with the incoming clock. The analog delay elements will vary by a very small amount compared with the fixed digital delay element (basically two inverters) and the complex mux logic has been eliminated. In place of the mux logic is a digital to analog converter 250 which must translate the digital output from the phase comparator and counter control 240 to analog signals. The digital to analog converter (DAC) will vary the current to each of the analog delay elements, therefore varying the amount of delay. Although this analog approach to the DLL circuit solves some of the aforementioned problems it has drawbacks of its own. Analog circuits are more complex than digital ones and are difficult to scale from one technology to another, especially at reduced voltages. Also, analog circuits consume more design resources than purely digital designs and are therefore very costly. Therefore, there is a need for a novel digital DLL circuit with an adjustable delay chain that does not require a digital to analog converter (DAC).

SUMMARY OF THE INVENTION

The present invention has been devised to provide a structure and method for a delay-lock-loop circuit with improved accuracy and range. There is provided, according to one aspect of the invention, a digital Delay-Lock-Loop (DLL) circuit and a method for producing a phase shift comprising a phase generator producing a first and second clock signal having a first and second rising edge, respectively, wherein a timing difference between the first and second rising edges is equal to a desired cycle time; a delay circuit operable to receive the first clock signal and to produce a delayed clock signal; and a latch element connected to the delay circuit, which is operable to check whether the delayed clock signal is delayed by an amount equal to the desired cycle time, wherein the delay circuit comprises a plurality of serially connected binary-weighted inverters, which are operable to adjust a delay of the delayed clock signal to be equal to the desired cycle time; and a phase-shifted delay circuit connected to the delay circuit, which is operable to produce multiple degrees of phase shift of the delayed clock signal.

The DLL circuit further comprises a filter connected to the latch element, wherein the filter is operable to send a final value of the delayed clock signal to the phase-shifted delay circuit. Also, the DLL circuit further comprises a digital average function generator connected to the filter, wherein the digital average function generator is operable to instantaneously average the previous eight comparisons of the delayed clock signal with the desired cycle time to produce a final value.

Alternatively, there is provided a digital Delay-Lock-Loop (DLL) circuit comprising a phase generator receiving a clock signal and outputting a first clock line and a second clock line, wherein a timing difference between the first clock line and the second clock line is equal to a desired cycle time; a first delay circuit receiving the first clock line and outputting a delayed clock signal; a second delay circuit receiving the delayed clock signal, wherein the second delay circuit produces a phase shift of the delayed clock signal; and a latch element operatively connected to the first delay circuit, wherein the latch element compares whether the delayed clock signal is delayed by an amount equal to the desired cycle time, and wherein the phase shift comprises multiple degrees of phase shift.

The delay circuit further comprises a plurality of serially connected binary-weighted delay elements, wherein the delay elements are operable to adjust a delay of the delayed clock signal to be equal to the desired cycle time. The DLL circuit further comprises a register connected to the latch element, wherein the register is operable to send a final value of the delayed clock signal to the phase-shifted delay circuit. Moreover, the DLL circuit further comprises a digital average function generator connected to the register, wherein the digital average function generator is operable to instantaneously average the previous eight comparisons of the delayed clock signal with the desired cycle time to produce the final value.

A method of producing a phase shift in a digital DLL circuit is provided, wherein the method comprises, first, generating a first clock signal having a first rising edge and a second clock signal having a second rising edge from a phase generator, wherein a timing difference between the first rising edge and the second rising edge is equal to a desired cycle time. The second step involves sending the first clock signal to a delay circuit. Then, the next step involves generating a delayed clock signal in the delay circuit. Thereafter, the next step involves comparing a delay of the delayed clock signal with the second clock signal in a latch element, wherein the latch element is connected to the delay circuit. The next step involves adjusting the delay circuit such that the timing of the delayed clock equals the timing of the second clock signal. The next step involves generating a phase shift of the delayed clock signal in a phase-shifted delay circuit, wherein the phase shift comprises multiple degrees of phase shift.

The method further comprises adjusting the delay of the delayed clock signal to be equal to that of the desired cycle time, wherein the step of adjusting occurs by controlling a plurality of binary-weighted inverters, which are included in the delay circuit. Moreover, the method further comprises transferring the final values controlling the binary-weighted inverters to the phase-shifted delay circuit, wherein the step of transferring is performed by a filter connected to the latch element. Also, the method further comprises instantaneously averaging the previous eight comparisons of the delayed clock signal with the desired cycle time to produce the final value, wherein the step of averaging occurs in a digital average function generator connected to the filter.

The advantages of the present invention over other DLLs are the following. First, the DLL circuit of the present invention is extremely accurate at fast frequencies, wherein the faster the cycle time, the more accurate. Second, implementation of the present invention uses a "mimic" delay line for providing the phase shift. This eliminates complex multiplexer-tree logic that hinders the accuracy of the DLL. Also, the DLL of the present invention requires very few cycles for "locking" after power-up. Most DLLs require an excess of 32K cycles. The faster the frequency, the fewer the locking cycles. At 500 MHz, about 700 cycles are required for locking.

Moreover, the effects of across chip line-width variations (ACLV) and others process variations are virtually eliminated by using a novel delay-line layout technique of the present invention where the phase delay is embedded into the main DLL delay using identical delay elements. Further, the DLL of the present invention is very flexible by providing many phases to choose from. The number of potential phases equals the cycle time divided by the number of delay elements. For example, if the cycle time is 2.0 ns and the number of delay elements is 32, then phase-shifted clocks can be provided occurring at 62 ps increments from 0 to 2.0 ns. Another advantage of the present invention is that the design complexity is rather small, and offers the following: technology scalability, technology portability, and fast design cycle times. Furthermore, the present invention accomplishes all of the above in a very simplified design using an adjustable delay chain circuit that does not require a digital to analog converter (DAC). Finally, the present design provides a stretchable delay circuit with a tuneable inverter element, which is both accurate and easily migrated between technologies.

BRIEF DESCRIPTION OF THE DRAWINGS

The invention will be better understood from the following detailed description of a preferred embodiment(s) of the invention with reference to the drawings, in which:

FIG. 8(*b*) is a schematic diagram of the delay elements of the DLL circuit of FIG. 4.

DETAILED DESCRIPTION OF PREFERRED EMBODIMENTS OF THE INVENTION

Figure 1:
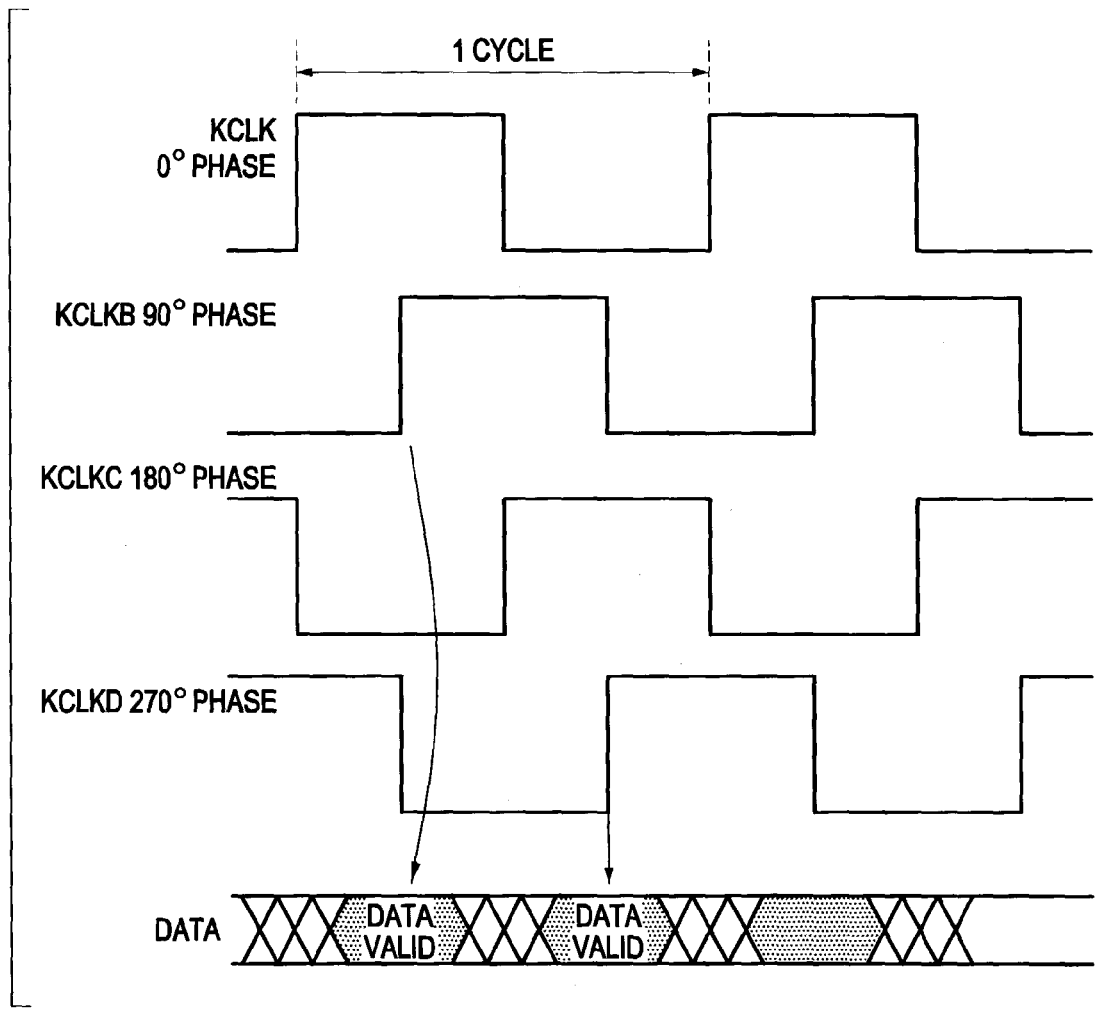
FIG. 1 is a schematic diagram of various clock signal derivation approaches.
Figure 2:
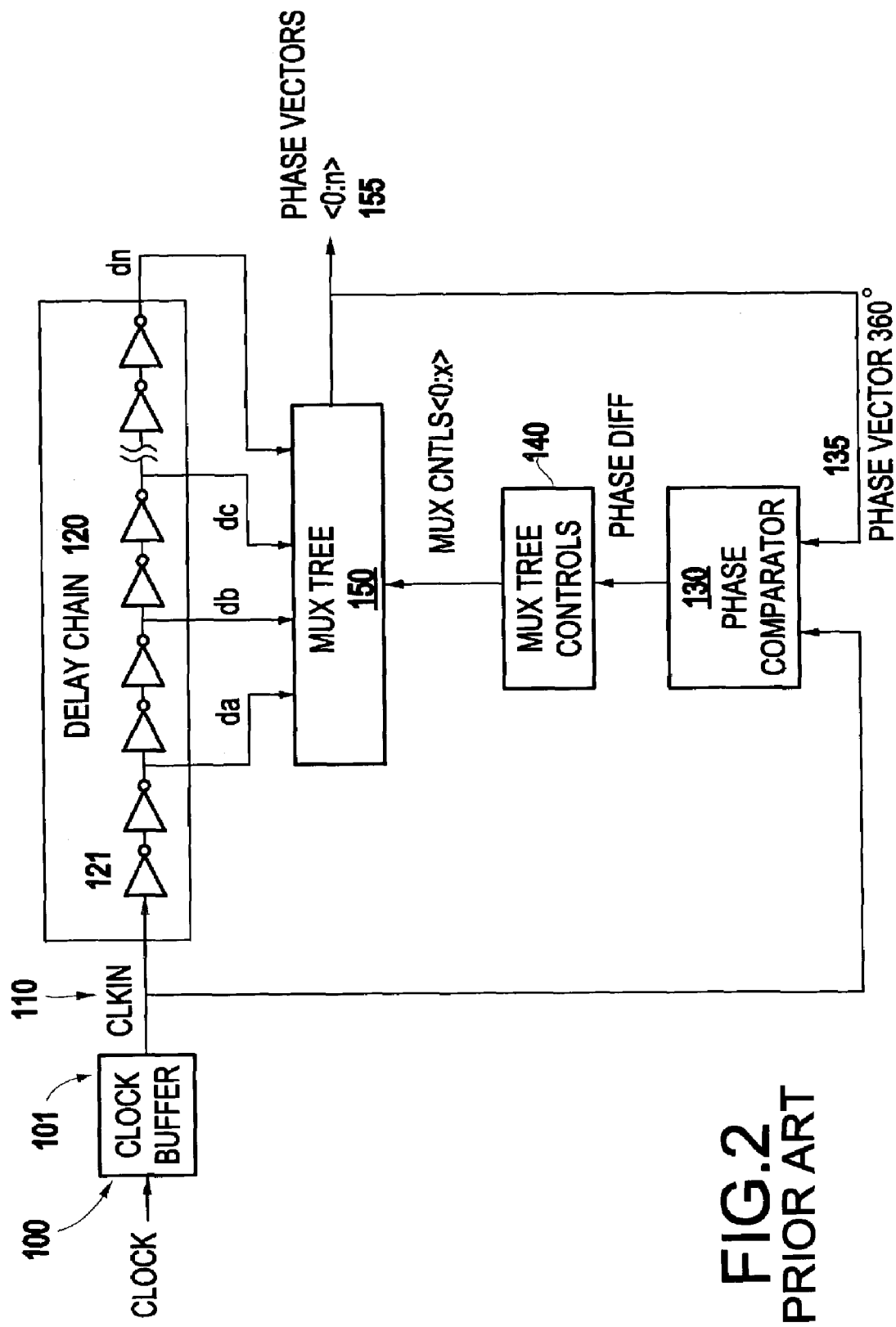
FIG. 2 is a schematic diagram of a conventional DLL circuit.
Figure 3:
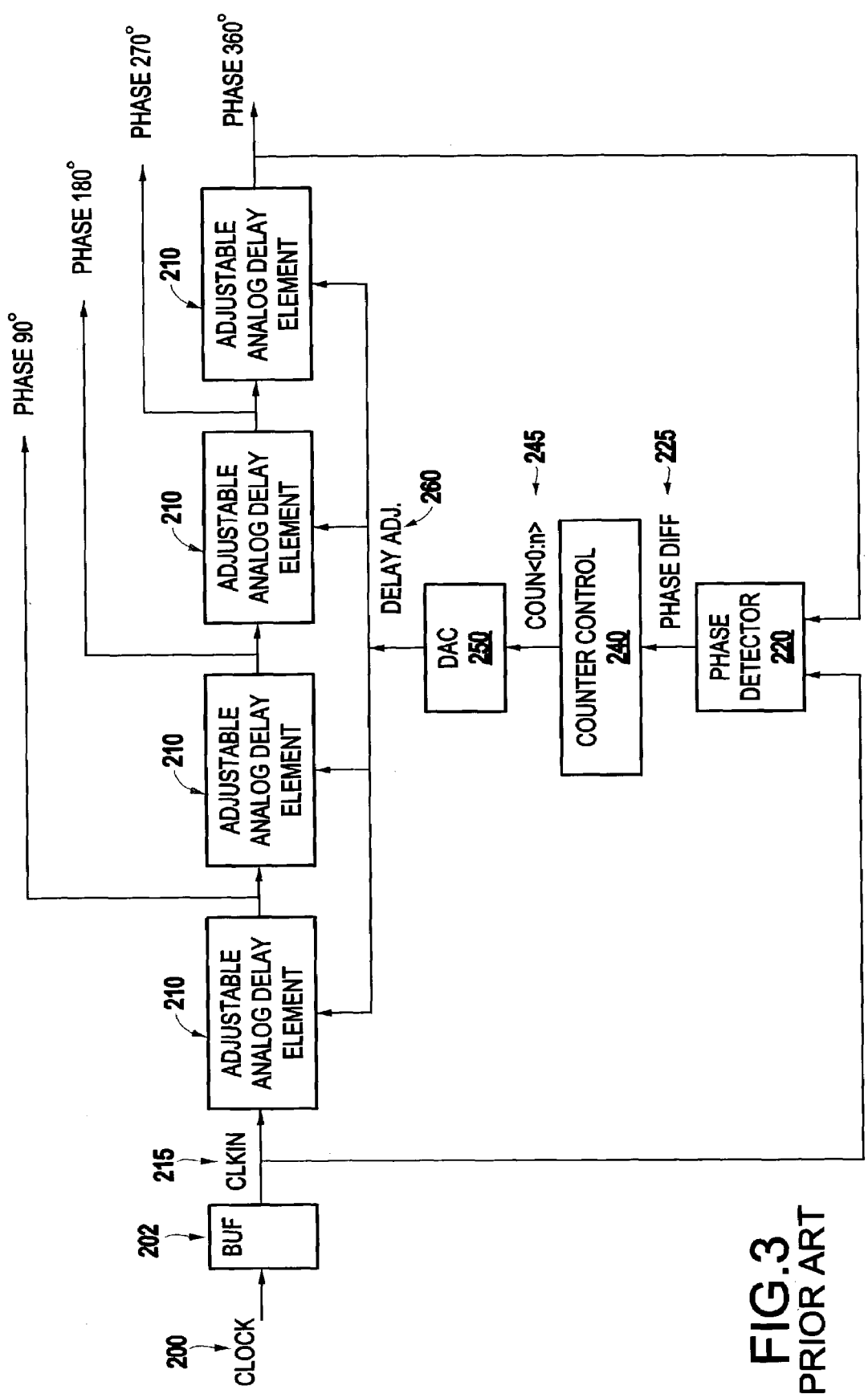
FIG. 3 is a schematic diagram of a conventional DLL circuit.

As previously mentioned, there is a need for a novel digital DLL circuit with an adjustable delay chain that does not require a digital to analog converter. Referring now to the drawings, and more particularly to FIGS. 4 through 9, there are shown preferred embodiments of the method and structures according to the present invention, in which there is provided a digital DLL circuit design which has improved accuracy and range.

Figure 4:
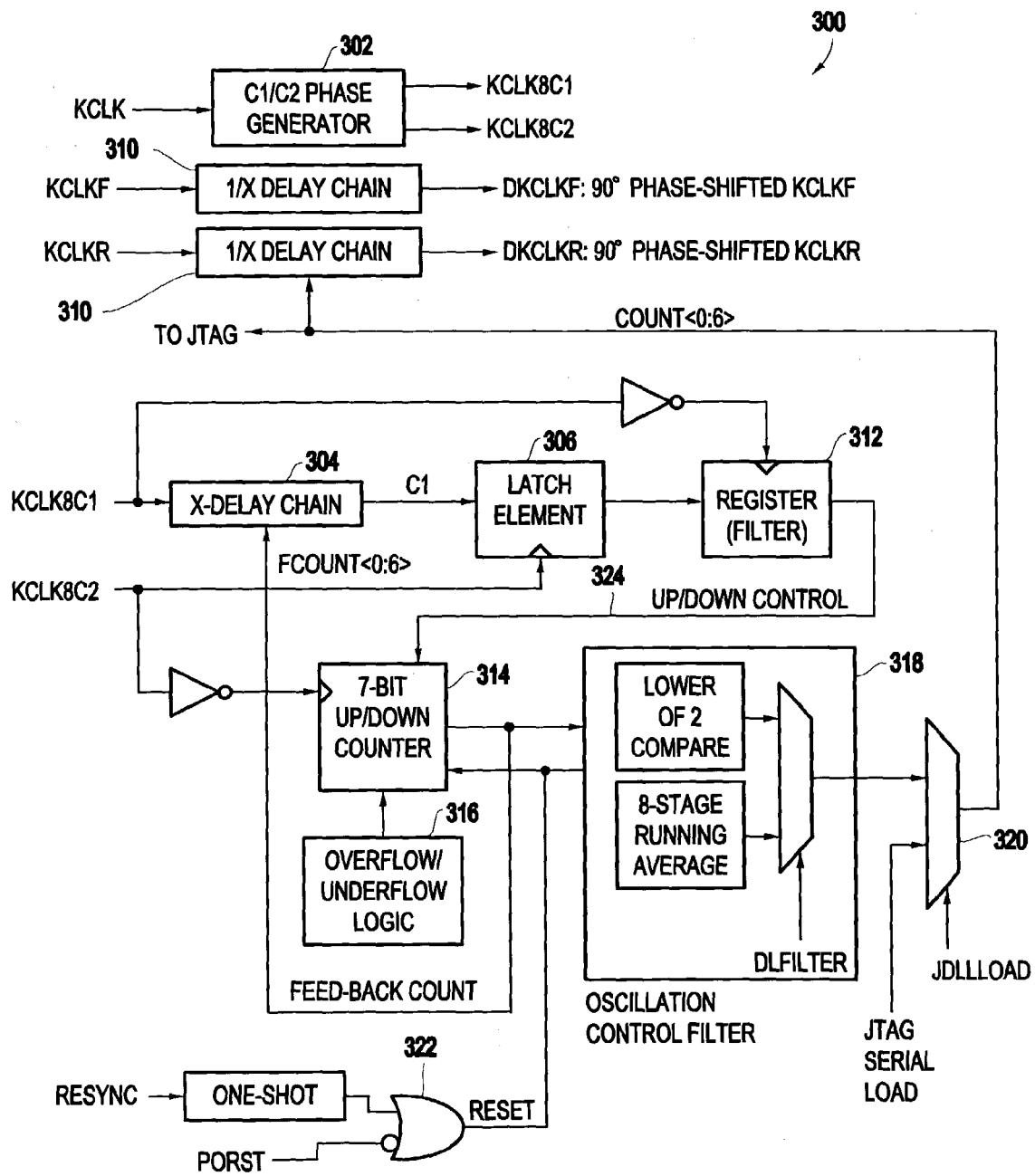
FIG. 4 is a schematic diagram of a DLL circuit according to the present invention.
Figure 5:
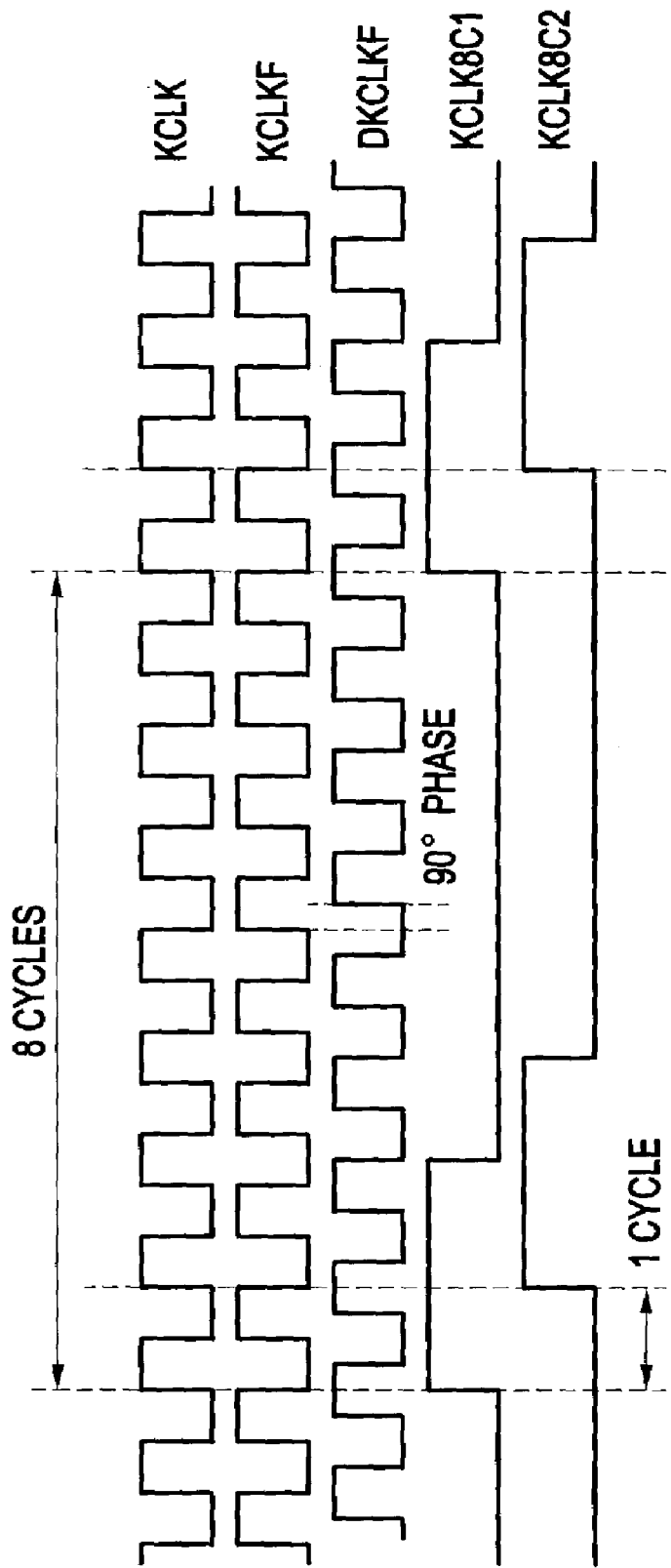
FIG. 5 is a schematic diagram of clock signal waveforms generated from the DLL circuit of FIG. 4.
Figure 6:
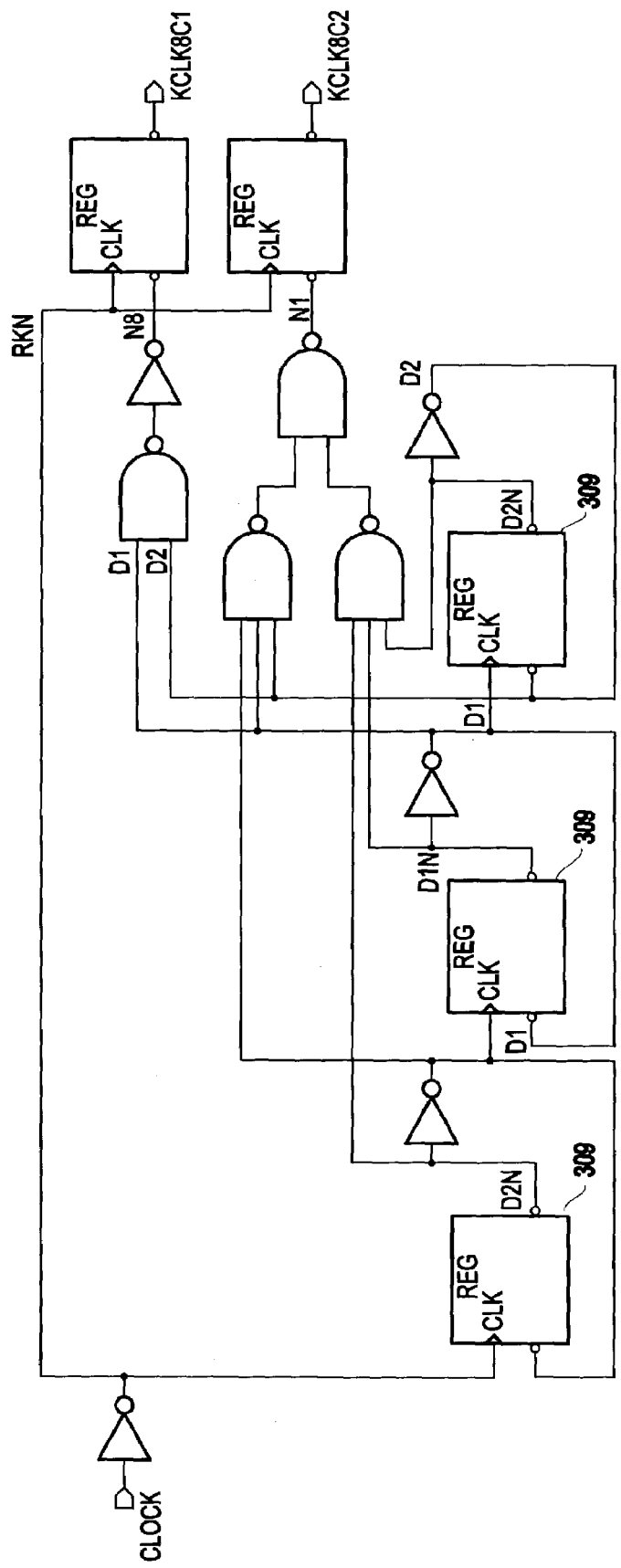
FIG. 6 is a schematic diagram of clock signal generation.

In FIG. 4 there is shown a digital Delay-Lock-Loop (DLL) circuit 300 comprising a C1/C2 clocks phase generator 302, which receives a clock signal KCLK, and produces a first clock signal KCLK8C1 and a second clock signal KCLK8C2 having a first and second rising edge, respectively, wherein a timing difference between the first and second rising edges is equal to a desired cycle time. These clocks KCLK8C1, KCLK8C2 are shifted in time by one cycle and have a clock high time of two cycles. They re-occur again every eight cycles. The waveforms associated with the DLL circuit 300 are further illustrated in FIG. 5, which shows the shift of the various clock signals. A three-bit linear counter shown as registers 309 in FIG. 6 provides the 8-cycle frequency. Moreover, the values of the counter must be continuously registered in order to preserve a perfect 1-cycle block shift between clock signals KCLK8C1 and KCLK8C2.

Figure 7:
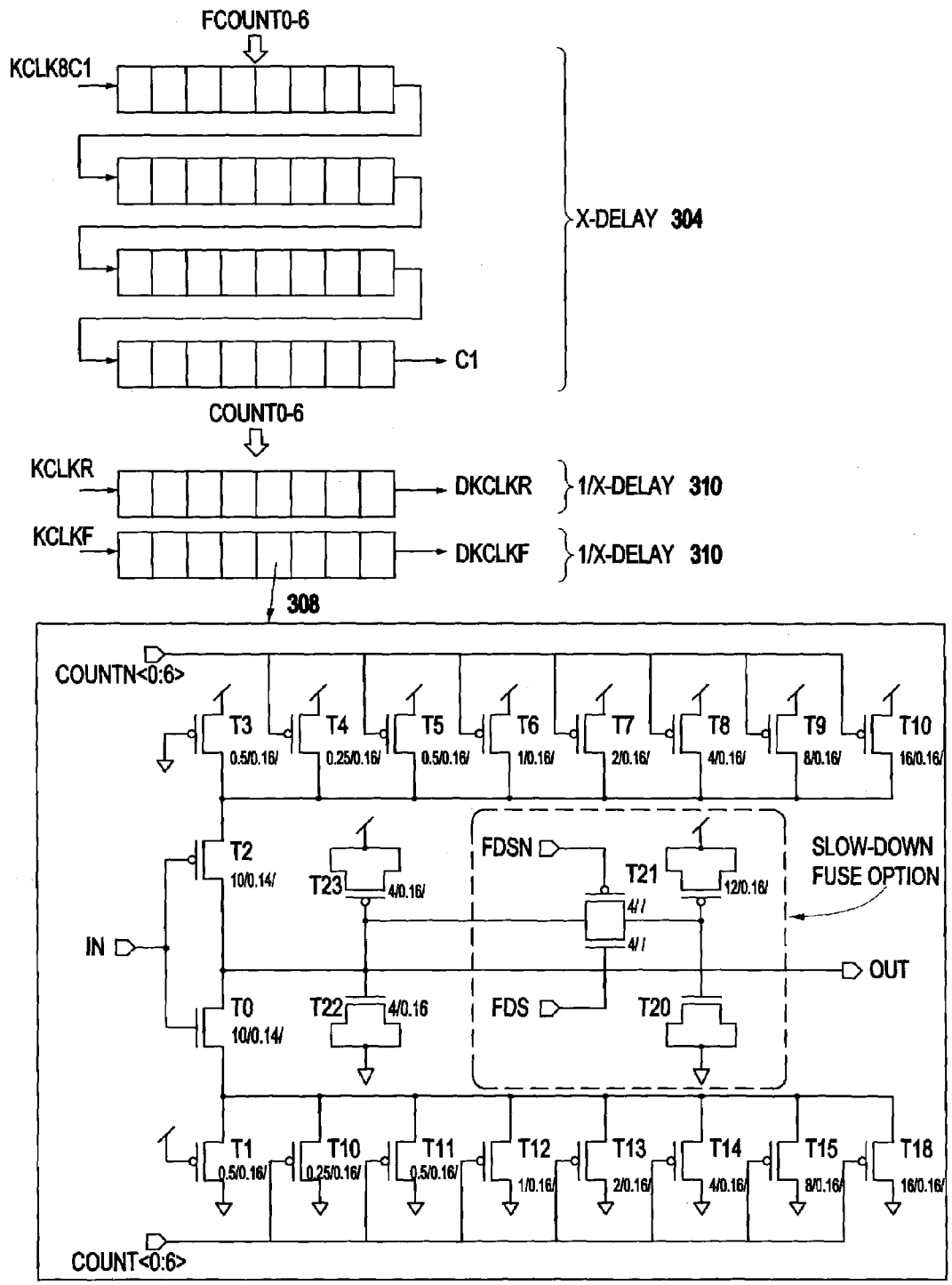
FIG. 7 is a schematic diagram of the delay elements of the DLL circuit of FIG. 4.

The DLL circuit 300 also includes a delay circuit 304 operable to receive the first clock signal KCLK8C1 and to produce a delayed clock signal C1. Also shown is a latch element 306 connected to the delay circuit 304, wherein the latch element 306 is operable to check whether the delayed clock signal C1 is delayed by an amount equal to the desired cycle time. Next, as best seen in FIG. 7, a plurality of serially connected binary-weighted inverters 308 are connected to the delay circuit 304, which are operable to adjust the delayed clock signal C1 to be equal to that of the desired cycle time. The DLL circuit 300 further comprises a phase-shifted delay circuit 310 connected to the delay circuit 304, which is operable to produce multiple degrees of phase shift DKCLKF, DKCLKR of the delayed clock signal C1.

The DLL circuit 300 also includes a register (filter) 312 connected to the latch element 306, wherein the filter 312 is operable to send a final value of the delayed clock signal C1 to the phase-shifted delay circuit 310. Furthermore, the output of filter 312 is a single signal that controls whether the counter 314 counts up or down. A 7-bit binary count output from counter 314 is used as the controlling signals (after the filter) for the delay elements 308 and the phase-shifted delay circuit 310. Also, the DLL circuit 300 further comprises a digital average function generator 318 connected to the filter 312, wherein the digital average function generator 318 is operable to instantaneously average the previous eight comparisons of the delayed clock signal C1 with the desired cycle time to produce a final value, which is outputted through a multiplexer 320 onto the phase-shifted delay circuit 310.

Other elements of the DLL circuit 300 include the 7-bit up/down counter 314 operatively connected to the filter 312 and to a logic circuit 316. Also, shown is a reset logic circuit 322 which receives a RESYNC instruction upon reset of the DLL circuit 300 during power-up, and after the reset allows the DLL circuit 300 to start with minimum delay.

The operation of the DLL circuit 300 occurs when a first clock line KCLK8C1 connects to a delay circuit 304 ("X-DELAY CHAIN" circuit) to produce a delayed clock signal C1. The X-Delay chain 304 comprises a series of (serially connected) binary-weighted inverters 308 that are adjusted to "fit" the cycle time of operation. Furthermore, a second clock line KCLK8C2 connects to the latch element 306 and a counter 314, further described below.

If clock signal KCLK8C1 goes high, then clock signal KCLK8C2 latches the value of delayed clock signal C1 on the next cycle. If delayed clock signal C1 is latched as a high, then more delay is added to the X-delay chain circuit 304. High refers to the logic state of the clock signal. It is either high at the power supply voltage or low at ground. High would be a logic "1", while low would be a logic "0". The KCLK8C2 clock is used to capture the state of the delayed KCLK8C1 signal (C1) at latch 306. If it captures a high, then C1 has transitioned from a low to high prior to KCLK8C2 going high, which means it needs to be delayed more to be able to match the delay for one clock cycle. If it captures a low, then C1 has been delayed too much and the delay through the delay chain needs to be decreased. This process continues until the delayed clock exactly matches clock KCLK8C2. When this happens the delay chain will exactly represent the delay required for 1 clock cycle, and clock phases can be obtained by using fractional sections of this delay chain 310. The delay is controlled by the 7-bit up/down counter 314 that reacts to the outcome of the latch element 306. As the delayed clock signal C1 continues to extend, it is ultimately latched as a low. At this point, the time delay though X-delay 304 exactly equals the cycle time of the incoming clock and the DLL is considered "locked-in" or simply "locked". The result from the latch element 306 is filtered through a register 312 one clock cycle after clock signal KCLK8C2 transitions to prevent a potential metastability condition from propagating to the counter 314.

Metastability is an undesirable condition. It occurs when a latch cannot resolve its state, resulting in the latch becoming locked in a state between a logic "1" and logic "0". When the delayed clock starts to become equal to the clock cycle time, and latch 306 just changes from latching in a high to latching in a low, it can be possible for latch 306 to become metastable. The register (filter) 312 is used to prevent a metastable state in latch 306 from propagating into the up/down counter 314, as a metastable input to the counter could cause it to fail. Furthermore, the counter 314 is incremented/decremented one cycle after the UP/DOWN control is registered. Moreover, the counter 314 is protected from over/under flow (via the logic circuit 316) and it is reset at power-up (via the reset logic circuit 322).

By resetting the counter 314 at power-up, the feedback count (FCOUNT <0:6>) to the X-delay chain 304 is set to a maximum count to provide the smallest delay. This feature provides cycle coherency by always causing the counter 314 to count in the correct direction of clock signal KCLK8C2 at power-up, thereby causing the counter 314 to start counting down to delay C1.

The output of the feedback count FCOUNT <0:6> is fed to an oscillation-control filter 318. This filter 318 selects the lower of two counts: present cycle and last cycle counts. The filter 318 generates a final value count COUNT <0:6> to the phase-shift delay chain circuit (I/X DELAY CHAIN) 310 which is oscillation free. For example, once the delayed clock signal C1 exceeds the timing of clock signal KCLK8C2, the delayed clock signal C1 is latched low, instructing the counter 314 to count UP. Thus, during the next cycle, the delayed clock signal C1 is faster than clock signal KCLK8C2 and it is latched high, instructing the counter 314 to count DOWN. This oscillation of the counter control 324 and feedback count FCOUNT <0:6> occurs when the optimum delayed clock signal C1 delay is produced. Moreover, the locked count to the phase-shifted delay is filtered from this oscillation. The phase delays are further explained in FIG. 7.

FIG. 7 shows both the X-delay chain 304 and the 1/X-delay chain (phase shift delay chain) 310 for a 90-degree clock shift example. The delay chains 304 comprise a series of serially connected binary-weighted delay elements 308.

The phase-shifted delay chain 310 is an exact multiple of the X-delay chain 304. For the 90-degree example given below, the phase-shift delay chain 310 takes ¼ of the total delays of the X-delay chain 304. By design, this mimic delay is naturally ¼ of the delay of the entire X-delay, thus producing the 90-degree shift. As a result, complex multiplexer trees, which are prevalent in conventional designs, are unnecessary to implement the phase-shifted clocks.

As implemented, the binary-weighted delay elements 308 produce extremely accurate results due to having a charge-sharing and load capacitor embedded in the topology, wherein the capacitor absorbs the stack-node charge. These results are achieved especially at fast cycle times where the accuracy is most important. In fact, by utilizing a binary-weighted delay implementation, the faster the cycle time, the smaller the jitter.

Figure 8A:
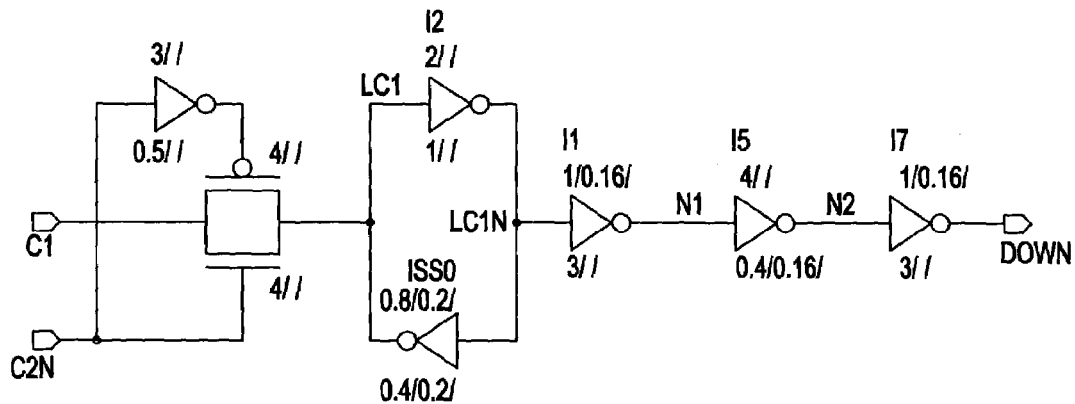
FIG. 8(*a*) is a schematic diagram of the latch element of the DLL circuit of FIG. 4.
Figure 8B:
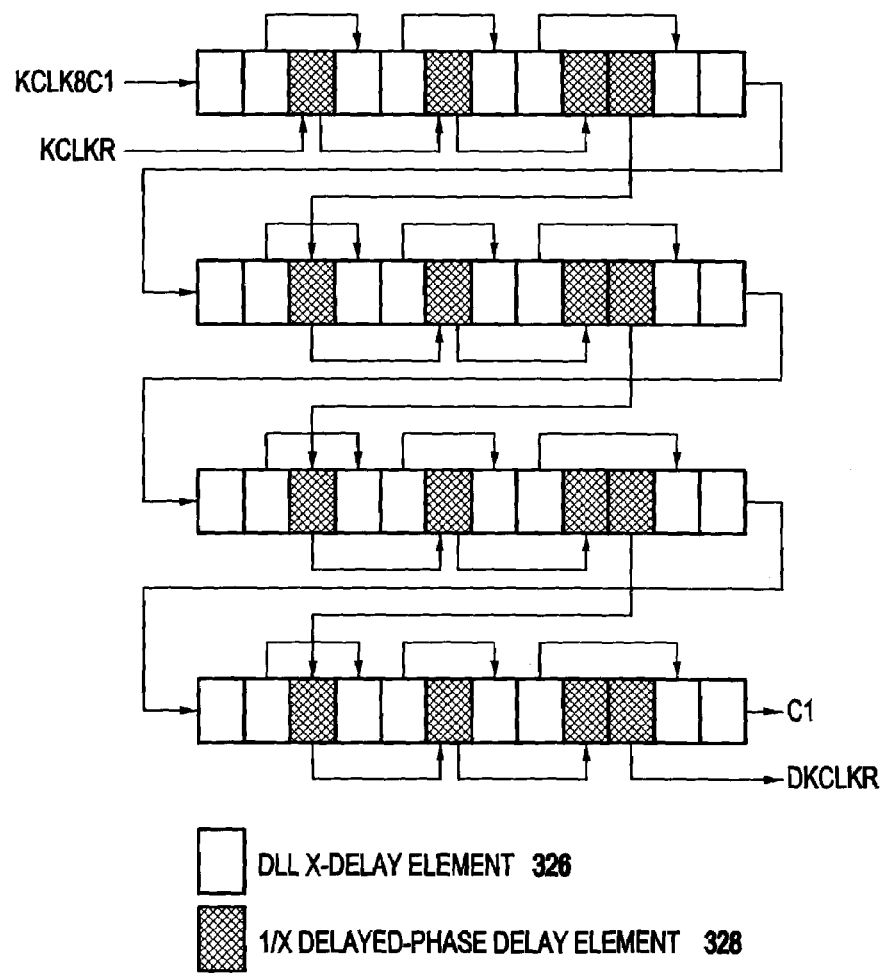

The latch element 306 is further shown in FIG. 8(a). The trip points of inverters 14, 15, and 17 are skewed to prevent signal DOWN from switching whenever the latch 306 is trying to resolve a mestastable level. This occurs whenever delayed clock signals C1 and C2N transition with no setup/hold times. FIG. 8(b) shows the layout topology used for the delay elements in order to minimize ACLV effects. ACLV describes how much a printed shape's width varies across a chip. In this instance, the line width describes the FET channel length. Minimizing variations on a chip or within a circuit is very important to maintain accuracy.

As shown, a unique feature of the present invention is that delay elements 328 used in the phase-delay chain 310 are intermixed with the main DLL delay elements 326 of the delay chain 304. Moreover, such a delay element layout topology, wherein the phase-delay elements 328 (mimic delays) which produce the phase shift within the delays which compare the cycle time are physically embedded with the delay elements 326 minimizes the ACLV. If shifts occur in Leffs, both delays are affected almost equally. In fact, the difference in timings from the localized variations is less than 15 ps for a 5 ns cycle. For a 2 ns cycle, the difference in timings is less than 5 ps. Leff is the FET device effective channel length, wherein the effective channel length will determine a device's performance and is directly affected by line-width variations.

Figure 9:
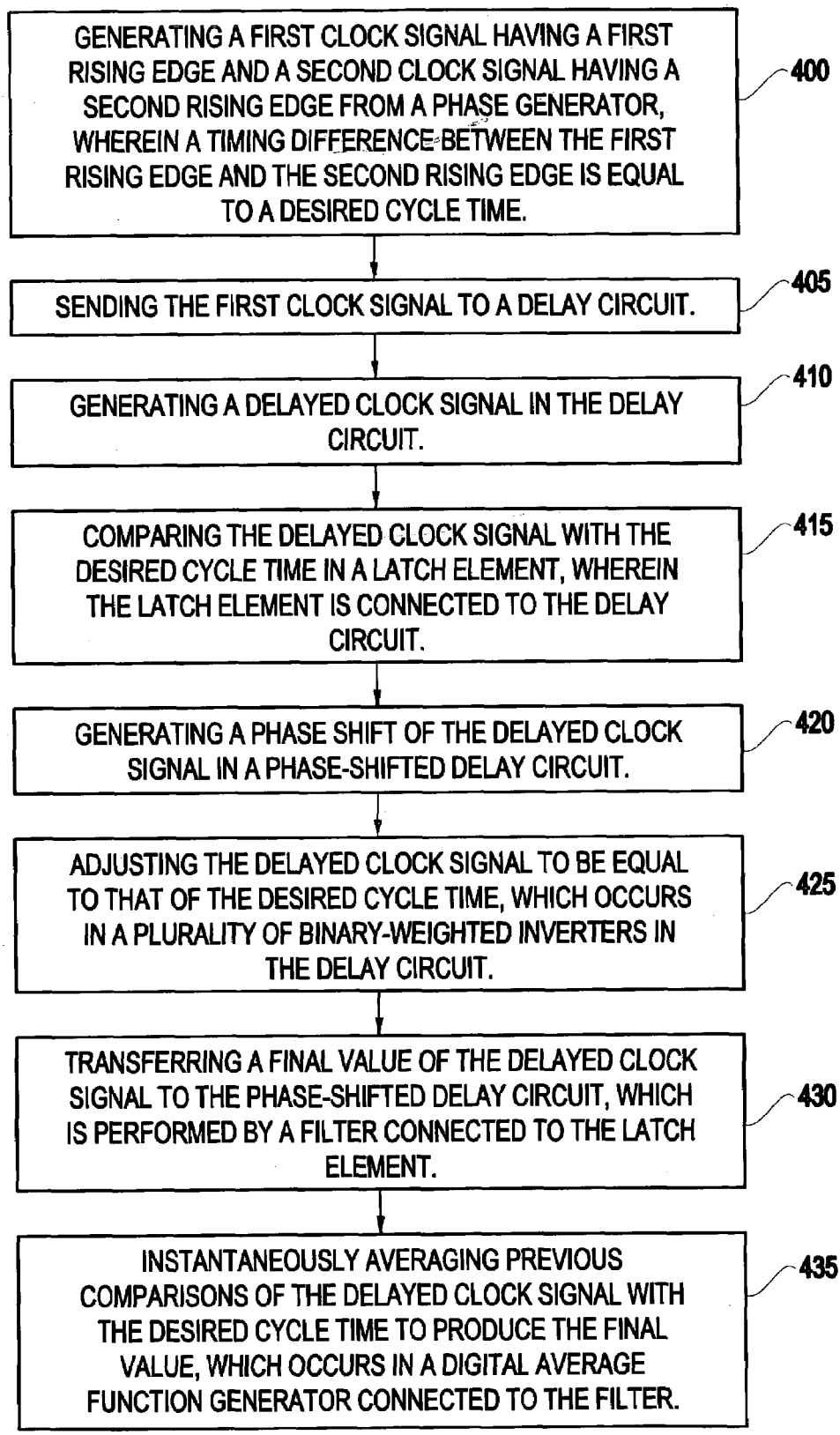
FIG. 9 is a flow diagram illustrating a preferred method of the invention.

A method of producing a phase shift in a DLL circuit 300 is provided in the flow diagram shown in FIG. 9, wherein the method comprises generating 400 a first clock signal KCLK8C1 having a first rising edge and a second clock signal KCLK8C2 having a second rising edge from a phase generator 302, wherein a timing difference between the first rising edge and the second rising edge is equal to a desired cycle time. The second step involves sending 405 the first clock signal KCLK8C1 to a delay circuit 304. Then, a delayed clock signal C1 is generated 410 in the delay circuit 304. Thereafter, the delay of the delayed clock signal C1 is compared 415 with the desired cycle time in a latch element 306, wherein the delay circuit 304 comprises the latch element 306. Next, a phase shift DKCLKF, DKCLKR of the delayed clock signal C1 is generated 420 in a phase-shifted delay circuit 310, wherein the phase shift DKCLKF, DKCLKR comprises multiple degrees of phase shift.

The method further comprises adjusting 425 the delay of the delayed clock signal C1 to be equal to that of the desired cycle time, wherein the step of adjusting 425 occurs in a plurality of binary-weighted inverters 308, which are in the delay circuit 304. Moreover, the method further comprises transferring 430 a final value of the delayed clock signal C1 to the phase-shifted delay circuit 310, wherein the step of transferring 430 is performed by a filter 312 connected to the latch element 306. Also, the method further comprises instantaneously averaging 435 the previous eight comparisons of the delayed clock signal C1 with the desired cycle time to produce the final value, wherein the step of averaging 435 occurs in a digital average function generator 318 connected to the filter 312.

The advantages of the present invention over other DLLs are the following. First, the DLL circuit of the present invention is extremely accurate at fast frequencies, wherein the faster the cycle time, the more accurate. Second, implementation of the present invention uses a "mimic" delay line for providing the phase shift. This eliminates complex multiplexer-tree logic that hinders the accuracy of the DLL. Also, the DLL of the present invention requires very few cycles for "locking" after power-up. Most DLLs require an excess of 32K cycles. The faster the frequency, the fewer the locking cycles. At 500 MHz, about 700 cycles are required for locking.

Moreover, the effects of across chip line variations (ACLV) and others process variations are virtually eliminated by using a novel delay-line layout technique of the present invention where the phase delay is embedded into the main DLL delay using identical delay elements. Further, the DLL of the present invention is very flexible by providing many phases to choose from. The number of potential phases equals the cycle time divided by the number of delay elements. For example, if the cycle time is 2.0 ns and the number of delay elements is 32, then phase-shifted clocks can be provided occurring at 62 ps increments from 0 to 2.0 ns. Another advantage of the present invention is that the design complexity is rather small, and offers the following: technology scalability, technology portability, and fast design cycle times. Furthermore, the present invention accomplishes all of the above in a very simplified design using an adjustable delay chain circuit that does not require a digital to analog converter (DAC). Finally, the present design provides a stretchable delay circuit with a tuneable inverter element, which is both accurate and easily migrated between technologies.

While the invention has been described in terms of preferred embodiments, those skilled in the art will recognize that the invention can be practiced with modification within the spirit and scope of the appended claims.

What is claimed is:

1. A digital Delay-Lock-Loop (DLL) circuit comprising:
a phase generator operable to produce a first clock signal having a first rising edge and a second clock signal having a second rising edge, wherein a timing difference between said first rising edge and said second rising edge is equal to a desired cycle time;
a binary-weighted delay circuit operable to receive said first clock signal and to produce a delayed clock signal;
a phase-shifted delay circuit connected to said binary-weighted delay circuit; and
a latch element connected to said binary-weighted delay circuit, said latch element operable to check whether said delayed clock signal is delayed by an amount equal to said desired cycle time, wherein at said latch element, said second clock signal is used to capture a delay of said first clock signal,
wherein delay elements of said binary-weighted delay circuit are intermixed with delay elements of said phase-shifted delay circuit.

2. The DLL circuit of claim 1, wherein said binary-weighted delay circuit comprises a plurality of binary-weighted inverters, said inverters operable to adjust a delay of said delayed clock signal to be equal to said desired cycle time.

3. The DLL circuit of claim 1, wherein said phase-shifted delay circuit is operable to produce a phase shift of said delayed clock signal, and wherein said phase-shifted delay circuit is configured as an exact multiple of said binary-weighted delay circuit.

4. The DLL circuit of claim 3, wherein said phase shift comprises multiple degrees of phase shift.

5. The DLL circuit of claim 1, further comprising a filter connected to said latch element, said filter operable to send a final value of said delayed clock signal to said phase-shifted delay circuit.

6. The DLL circuit of claim 5, further comprising a digital average function generator connected to said filter, wherein said digital average function generator is operable to instantaneously average previous comparisons of said delayed clock signal with said desired cycle time to produce said final value.

7. The DLL circuit of claim 6, wherein said previous comparisons equal eight most recent previous comparisons.

8. A digital Delay-Lock-Loop (DLL) circuit comprising:
a phase generator receiving a clock signal and outputting a first clock line and a second clock line, wherein a tiring difference between said first clock line and said second clock line is equal to a desired cycle time;
a first delay circuit receiving said first clock line and outputting a delayed clock signal, wherein said first delay circuit comprises a binary-weighted delay circuit;
a second delay circuit receiving said delayed clock signal and producing a phase shift of said delayed clock signal; and
a latch element operatively connected to said first delay circuit, wherein said latch element compares whether said delayed clock signal is delayed by an amount equal to said desired cycle time, wherein at said latch element, said second clock signal is used to capture a delay of said first clock signal,
wherein delay elements of said first delay circuit are intermixed wit delay elements of said second delay circuit, and
wherein said second delay circuit is configured as an exact multiple of said first delay circuit.

9. The DLL circuit of claim 8, wherein said first delay circuit comprises a plurality of serially connected binary-weighted delay elements, wherein said delay elements are operable to adjust a delay of said delayed clock signal to be equal to said desired cycle time.

10. The DLL circuit of claim 8, wherein said phase shift comprises multiple degrees of phase shift.

11. The DLL circuit of claim 8, further comprising a register connected to said latch element, said register operable to said a final value of said delayed clock signal to second delay circuit.

12. The DLL circuit of claim 11, further comprising a digital average function generator connected to said register, wherein said digital average function generator is operable to instantaneously average previous comparisons of said delayed clock signal with said desired cycle time to produce said final value.

13. The DLL circuit of claim 12, wherein said previous comparisons equal eight most recent previous comparisons.

14. A method of producing a phase shift in a digital Delay-Lock-Loop (DLL) circuit, said method comprising:
generating a first clock signal having a first rising edge and a second clock signal having a second rising edge from a phase generator, wherein a timing difference between said first rising edge and said second rising edge is equal to a desired cycle time;
sending said first clock signal to a binary-weighted delay circuit;
generating a delayed clock signal in said binary-weighted delay circuit;
comparing a delay of said delayed clock signal with said desired cycle time in a latch element, wherein said binary-weighted delay circuit comprises said latch element; and
generating a phase shift of said delayed clock signal in a phase-shifted delay circuit,
wherein delay elements of said binary-weighted delay circuit are intermixed with delay elements of said phase-shifted delay circuit, and
wherein said phase-shifted delay circuit is configured as an exact multiple of said binary-weighted delay circuit.

15. The method of claim 14, further comprising adjusting said delay of said delayed clock signal to be equal to that of said desired cycle time, wherein said adjusting occurs in a plurality of binary-weighted inverters in said binary-weighted delay circuit.

16. The method of claim 14, wherein said phase shift comprises multiple degrees of phase shift.

17. The method of claim 14, further comprising transferring a final value of said delayed clock signal to said phase-shifted delay circuit, wherein said transferring is performed by a filter connected to said latch element.

18. The method of claim 17, further comprising averaging previous comparisons of said delayed clock signal with said desired cycle time to produce said final value, wherein said averaging occurs in a digital average function generator connected to said filter.

19. The method of claim 18, wherein said previous comparisons equal eight most recent previous comparisons.

20. The method of claim 18, wherein said averaging occurs instantaneously.

* * * * *